(12) United States Patent
Cho et al.

(10) Patent No.: US 7,750,742 B2
(45) Date of Patent: Jul. 6, 2010

(54) ENHANCED ALL DIGITAL PHASE-LOCKED LOOP AND OSCILLATION SIGNAL GENERATION METHOD THEREOF

(75) Inventors: Seonghwan Cho, Daejeon (KR); Wookon Son, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 38 days.

(21) Appl. No.: 12/264,811

(22) Filed: Nov. 4, 2008

(65) Prior Publication Data

US 2009/0160564 A1     Jun. 25, 2009

(30) Foreign Application Priority Data

Dec. 20, 2007   (KR)   ................. 10-2007-0133890

(51) Int. Cl.
 *H03L 7/06*    (2006.01)
 *H03L 7/16*    (2006.01)
(52) U.S. Cl. .................. 331/18; 331/1 A; 331/16; 331/17; 331/25
(58) Field of Classification Search ............. 331/1 A, 331/16–18, 25; 327/156–159; 332/127; 360/51; 375/376; 455/260
 See application file for complete search history.

(56) References Cited

U.S. PATENT DOCUMENTS

| | | | |
|---|---|---|---|
| 5,528,240 A * | 6/1996 | Wilson et al. | ............... 341/143 |
| 5,974,105 A | 10/1999 | Wang et al. | |
| 6,900,675 B2 | 5/2005 | Briones | |
| 7,385,539 B2 | 6/2008 | Vanselow et al. | |
| 2007/0200638 A1 | 8/2007 | Sandner et al. | |

OTHER PUBLICATIONS

Moorthi, et al.; "Low Jitter ADPLL based Clock Generator for High Speeds SoC Applications"; Proceedings of World Academy of Science, Engineering and Technology, vol. 32. Aug. 2008; pp. 743-746.
Chung, et al.; "An All-Digital Phase-Locked Loop for High-Speed Clock Generation"; IEEE, 2002, pp. 679-682.

* cited by examiner

*Primary Examiner*—David Mis
(74) *Attorney, Agent, or Firm*—Christie, Parker & Hale, LLP

(57) ABSTRACT

An All Digital PLL (ADPLL) and oscillation signal generation method using the ADPLL is provided for generating a spur-free oscillation signal by improving the frequency resolution of the ADPLL. An all digital phase-locked loop of the present invention includes a digitally controlled oscillator for generating an oscillation signal having a frequency corresponding to an inputted control signal, a re-timer for retiming a reference clock based on the oscillation signal, a feedback circuit for accumulating a number of clocks of the oscillation signal within a time period and generating a phase information of the oscillation signal in synchronization with the retimed reference clock, a sigma-delta modulator for sigma-delta modulating a frequency command signal into a modulation signal having a less number of bits than a number of bits of the frequency command signal, a reference phase accumulator for accumulating phases corresponding to the modulation signal, a phase difference detector for generating a phase difference information between an output signal of the reference phase accumulator and the phase information, and a digital loop filter for filtering the phase difference information to generate the control signal.

25 Claims, 6 Drawing Sheets

ENHANCED ALL DIGITAL PHASE-LOCKED LOOP AND OSCILLATION SIGNAL GENERATION METHOD THEREOF

CROSS-REFERENCE TO RELATED APPLICATION

This application claims priority to and the benefit of Korean Patent Application No. 10-2007-0133890, filed in the Korean Intellectual Property Office on Dec. 20, 2007, the entire content of which is incorporated herein by reference.

BACKGROUND OF THE INVENTION

1. Field of the Invention

The present invention relates to a Phase-Locked Loop (PLL) and, in particular, to an All Digital PLL (ADPLL) and oscillation signal generation method thereof that is capable of generating a spur-free oscillation signal by improving the frequency resolution of the ADPLL.

2. Description of the Related Art

With the advance of silicon processing technologies, the gate length of Metal Oxide Semiconductor (MOS) transistor has become shorter and shorter, whereby the performance of an analog circuit is likely to be influenced by change in fabrication process, voltage, and temperature. PLL is one of representative analog circuitry systems, such that it should be designed in consideration of such factors. One approach to reduce the influence by the variation of those factors is to replace the analog circuit of the PLL with a digital circuit.

An All Digital PLL (ADPLL) is a digital system implemented with digital logics except for the Digitally Controlled Oscillator (DCO) for generating oscillation signals. The ADPLL is less sensitive to the changes of the fabrication process, voltage, and temperatures and can be implemented by combining digital circuits, thereby facilitating design freedom in comparison with the analog PLL.

FIG. 1 is a circuit diagram illustrating a conventional ADPLL.

As shown in FIG. 1, the ADPLL 100 includes a DCO 110, a main feedback circuit 120 for feeding back the output signal of the DCO 110, a phase detector 132 for detecting a phase difference between the output signal of a phase accumulator 131 and the feedback signal, and a digital loop filter 140 for filtering the detected phase difference.

In the meantime, the ADPLL is sensitive to the quantization noise caused by the system's resolution limit, whereas it is less influenced by the variation of process, voltage, temperature, and analog noise characteristics in comparison with the analog PLL. Typically, the quantization noise is generated at the phase detector 132 and DCO 110, and the least phase difference interval that the phase detector 132 can measure is restricted by an inverter delay of a time-to-digital converter 123. The quantization noise increases the phase noise of the output signal of the ADPLL and forms a periodic pattern to incur spurs.

The digital loop filter 140 of the conventional ADPLL 100 has two paths: one is a Proportional Path 142, and the other is an Integral Path 141. In order to secure the system stability, the scale factor ($\alpha$) of the first path 142 should be greater than the scale factor ($\beta$) of the second path 141 and, otherwise, the ADPLL 100 may diverge. Among the quantization noises influencing to the performance of ADPLL 100, the quantization noise of the phase detector 132 propagates to the DCO 110 through the first and second paths 142 and 141. Since the scale factor ($\alpha$) of the first path 142 is greater than the scale factor ($\beta$), the DCO 110 is influenced predominantly by the quantization noise propagated via the first path 142.

In the conventional ADPLL, it is required to increase a number of bits of the frequency command signal (N) in order to increase the frequency resolution. However, increase of the bit number of the frequency command signal (N) causes the increase of the entire system bit number, resulting in increase of system complexity.

Accordingly, there has been a need for an enhanced ADPLL that is capable of canceling spurs with improvement of frequency resolution without compromising system complexity.

SUMMARY OF THE INVENTION

In order to overcome the problems of the above prior arts, the present invention provides an enhanced ADPLL and oscillation signal generation method using the ADPLL that is capable of improving frequency resolution and canceling frequency spurs.

In accordance with an exemplary embodiment of the present invention, an all digital phase-locked loop includes a digitally controlled oscillator for generating an oscillation signal having a frequency corresponding to an inputted control signal, a re-timer for retiming a reference clock based on the oscillation signal, a feedback circuit for accumulating a number of clocks of the oscillation signal within a time period and generating a phase information of the oscillation signal in synchronization with the retimed reference clock, a sigma-delta modulator for sigma-delta modulating a frequency command signal into a modulation signal having a less number of bits than a number of bits of the frequency command signal, a reference phase accumulator for accumulating phases corresponding to the modulation signal, a phase difference detector for generating a phase difference information between an output signal of the reference phase accumulator and the phase information, and a digital loop filter for filtering the phase difference information to generate the control signal.

In accordance with another exemplary embodiment of the present invention, an all digital phase-locked loop includes a digitally controlled oscillator for generating an oscillation signal having a frequency corresponding to an inputted control signal, a re-timer for retiming a reference clock based on the oscillation signal, a feedback circuit for accumulating a number of clocks of the oscillation signal within a time period and generating a phase information of the oscillation signal in synchronization with the retimed reference clock, a phase displacement calculator for calculating a phase displacement of the phase information of the oscillation signal within a time period, a sigma-delta modulator for sigma-delta modulating a frequency command signal into a modulation signal having a less number of bits than a number of bits of the frequency command signal, a frequency difference detector for detecting a frequency difference between a frequency corresponding to the modulation signal and a frequency corresponding to the phase displacement, a frequency difference accumulator for generating a phase difference information by accumulating the frequency difference; and a digital loop filter for filtering the phase difference information to generate the control signal.

In accordance with another exemplary embodiment of the present invention, an all digital phase-locked loop includes a digitally controlled oscillator for generating an oscillation signal having a frequency corresponding to an inputted control signal, a re-timer for retiming a reference clock based on the oscillation signal, a main feedback circuit for accumulating a number of clocks of the oscillation signal within a time period and generating a phase information of the oscillation signal in synchronization with the retimed reference clock, an auxiliary feedback circuit for scaling a phase difference information and feeding back the scaled phase difference information, a sigma-delta modulator for sigma-delta modulating a value obtained by subtracting the scaled phase difference information from a frequency command signal into a modulation signal having a less number of bits than a number of bits of the frequency command signal, a reference phase accumulator for accumulating a phase corresponding to the modulation signal, a phase difference detector for detecting a difference between an output signal of the reference phase accumulator and the phase information of the oscillation signal and generating the phase difference information, and a digital loop filter for filtering the phase difference information to generate the control signal.

In accordance with another exemplary embodiment of the present invention, an all digital phase-locked loop includes a digitally controlled oscillator for generating an oscillation signal having a frequency corresponding to an inputted control signal, a re-timer for retiming a reference clock based on the oscillation signal, a main feedback circuit for accumulating a number of clocks of the oscillation signal within a time period and generating phase information of the oscillation signal in synchronization with the retimed reference clock, an auxiliary feedback circuit for scaling a phase difference information and feeding back the scaled phase difference information, a phase displacement calculator for calculating a phase displacement of the phase information of the oscillation signal in a predetermined time period, a sigma-delta modulator for sigma-delta modulating a value obtained by subtracting the scaled phase difference information from a frequency command signal into a modulation signal having a less number of bits than a number of bits of the frequency command signal, a frequency difference detector for detecting a frequency difference between a frequency corresponding to the modulation signal and a frequency corresponding to the phase displacement, a frequency difference accumulator for generating the phase difference information by accumulating the frequency difference; and a digital loop filter for filtering the phase difference information to generate the control signal.

In accordance with another exemplary embodiment of the present invention, a method for generating an oscillation signal using an all digital phase-locked loop includes generating an oscillation signal of a frequency corresponding to an inputted control signal, retiming a reference clock based on the oscillation signal, generating a phase information of the oscillation signal by accumulating a number of clocks of the oscillation signal in synchronization with the retimed reference clock, scaling the phase difference information, feeding back the scaled phase difference information, sigma-delta modulating a signal obtained by subtracting a value corresponding to the phase difference information from a frequency command signal into a modulation signal, and generating the control signal on the basis of the phase information of the oscillation signal and the modulation signal.

BRIEF DESCRIPTION OF THE DRAWINGS

The above and other objects, features and advantages of the present invention will be more apparent from the following detailed description in conjunction with the accompanying drawings, in which.

DETAILED DESCRIPTION OF EXEMPLARY EMBODIMENTS

While the present invention is described with reference to what are presently considered to be the embodiments, it is to be understood that the invention is not limited to the disclosed embodiments. On the contrary the invention is intended to cover various modifications and equivalent arrangements included within the sprit and scope of the appended claims. The same reference numbers are used throughout the drawings to refer to the same or like parts.

The terms first and second are used herein merely to differentiate similar structures and functions but the structures and functions are not limited by the terms. For example, a first element may be called second element and the second element also may be called first element within the sprit and scope of the appended claims.

The terms appearing while describing the exemplary embodiments are used only for purposes of description but not intended to be used as limitations. The singular expression includes the plural, unless a contrary intention appears. In the descriptions, the terms "comprise," "include," and "have" are intended to cover a non-exclusive inclusion, such that a process, method, article, or apparatus that comprises a list of elements is not necessarily limited to those elements, but may include other elements not expressly listed or inherent to such process, method, article, or apparatus.

The terms and words used in the detailed description and claims are not limited to the bibliographical meanings, but, can be defined by the inventor to enable a clear and consistent understanding of the invention. Accordingly, it is apparent to those skilled in the art that the following descriptions of the embodiments of the present invention are provided for illustration only and not for the purpose of limiting the invention as defined by the appended claims and their equivalents.

Exemplary embodiments of the present invention are described hereinafter with reference to the accompanying drawings in detail. The same reference numbers are used throughout the drawings to refer to the same or like parts. Detailed descriptions of well-known functions and structures incorporated herein may be omitted to avoid obscuring the subject matter of the present invention.

Figure 2:
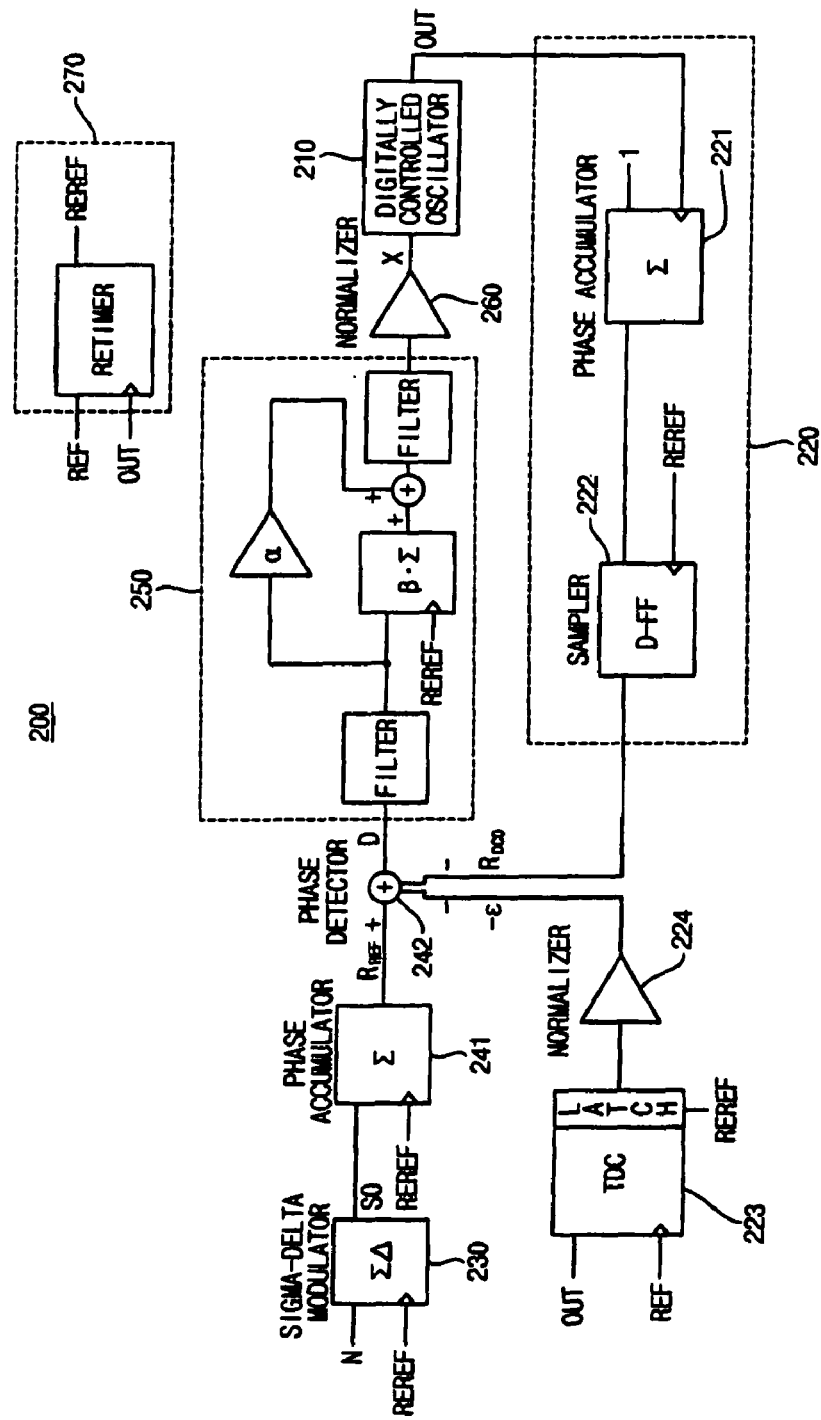
FIG. 2 is a circuit diagram illustrating a configuration of an ADPLL according to an exemplary embodiment of the present invention.

FIG. 2 is a circuit diagram illustrating a configuration of an ADPLL according to an exemplary embodiment of the present invention.

Referring to FIG. 2, the ADPLL 200 includes a DCO 210, a re-timer 270, a feedback circuit 220, a sigma-delta modulator 230, a reference phase accumulator 241, a phase difference detector 242, and a digital loop filter 250. The ADPLL 200 may further include a time-to-digital converter (TDC) 223 and a normalizer 224.

The DCO 210 outputs an oscillation signal (OUT) of a frequency corresponding to a digital control signal (X). The frequency of the oscillation signal (OUT) is proportional to the digital control signal (X).

The re-timer 270 outputs a reference signal (REF) in synchronization with the oscillation signal (OUT). The signal (REREF) retimed by the re-timer 270 is used as a clock signal for the devices of the feedback circuit 220, sigma-delta modulator 230, reference phase accumulator 241, and digital loop filter 250.

The feedback circuit 220 counts clocks of the oscillation signal (OUT) and generates the phase information (RDCO) of the oscillation signal in synchronization with the retimed reference clock.

The feedback circuit 220 includes an oscillation signal phase accumulator 221 and an extractor 222.

The oscillation signal phase accumulator 221 accumulates the clock count of the oscillation signal output by the DCO 221. In this embodiment, the oscillation signal phase accumulator 221 receives the oscillation signal (OUT) through a clock terminal and outputs and a logic high value input through an input terminal and then outputs the clock count of the accumulated oscillation signal (OUT). The extractor 222 synchronizes the clock count of the accumulated oscillation signal with the retimed reference clock (REFER) and outputs the synchronized clock count as the phase information (RDCO) of the oscillation signal.

The TDC 223 converts the phase difference between the reference clock (REF) and the phase of the oscillation signal (OUT) to a digital code. The TDC 223 latches the digital code such that the latched digital coded is output in synchronization with the retimed reference clock information (REFER).

The normalizer 224 normalizes the digital code output by the TDC 223 and outputs the normalized digital code to the phase difference detector 242.

The sigma-delta modulator 230 performs sigma-delta modulation on the frequency command signal (N). Typically, the output signal of the sigma-delta modulator 230 has less bit number than the frequency command signal (N). In this embodiment, the ADPLL 200 having the sigma-delta modulator 230 increases the bit number of the frequency signal without increasing entire number of bits to be processed by the system so as to increase the number of bits processed in the signal-delta modulator 230, resulting in improvement of the resolution. That is, the system resolution of the ADPLL 200 is improved by increasing only the complexity of the sigma-delta modulator 230.

The reference phase accumulator 241 accumulates the modulation signal (SO) output by the sigma-delta modulator 230 and outputs reference phase information (RREF) to the phase difference detector 242.

The phase difference detector 242 detects the difference between the reference phase information (RREF) and the phase information of the oscillation signal (RDCO) and outputs phase difference information (D) to the digital loop filter 250.

The digital loop filter 250 filters the phase difference information (D) and outputs the control signal (X) to the DCO 210. The ADPLL 200 may further include a normalizer 260 for calibrating the control signal (X).

Figure 3:
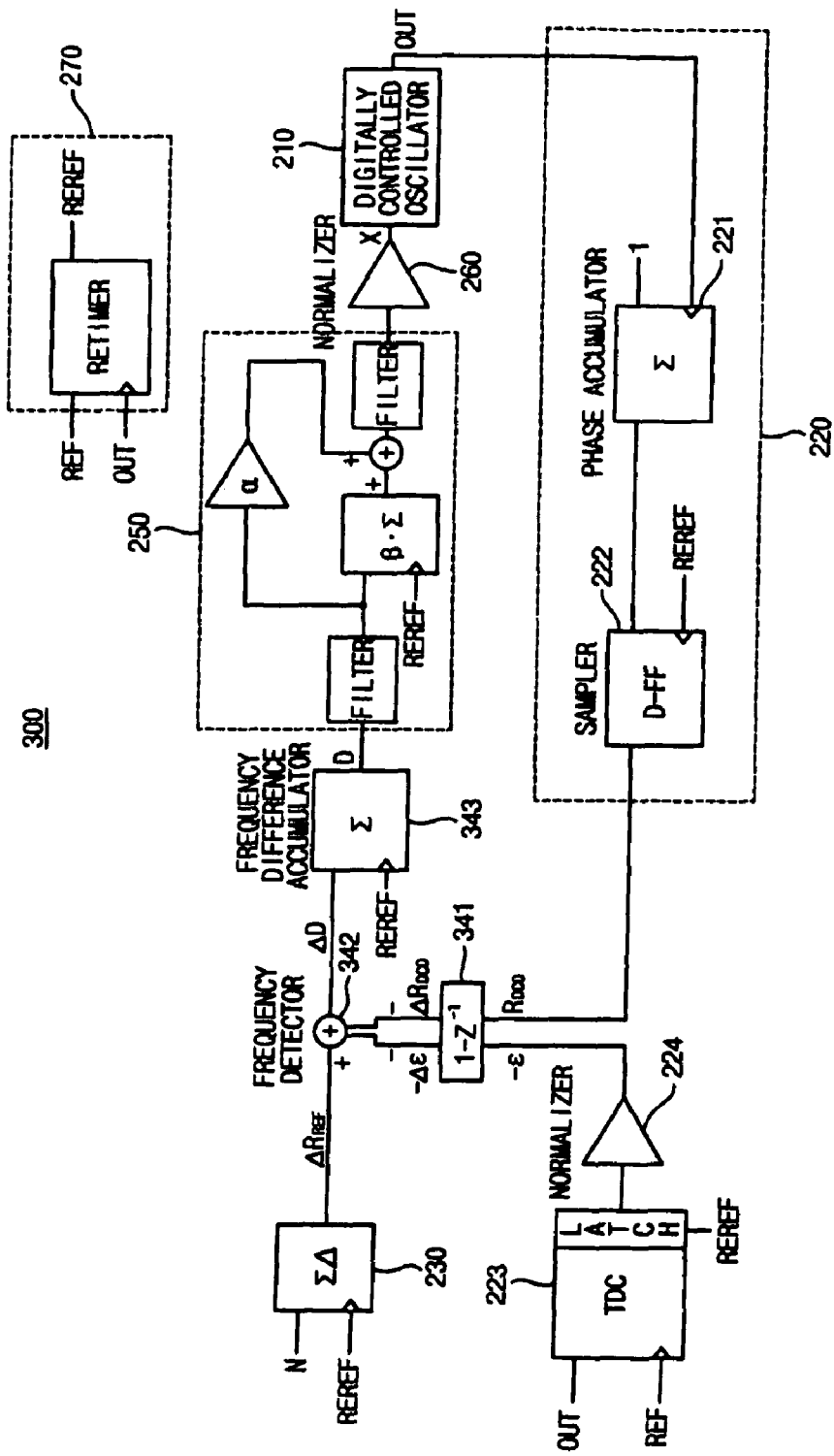
FIG. 3 is a circuit diagram illustrating a configuration of an ADPLL according to another exemplary embodiment of the present invention.

FIG. 3 is a circuit diagram illustrating a configuration of an ADPLL according to another exemplary embodiment of the present invention.

Referring to FIG. 3, the ADPLL 300 includes a digitally controlled oscillator (DCO) 210, a re-timer 270, a feedback circuit 220, a sigma-delta modulator 230, a phase displacement calculator 341, a frequency difference detector 342, a frequency difference accumulator 343, and a digital loop filter 250. The ADPLL 300 may further include a time-to-digital converter (TDC) 223 and a normalizer 224.

Since the structures and operations of the DCO 210, re-timer 270, feedback circuit 220, digital loop filter 250, TDC 223, and normalizer 224 constituting the ADPLL 300 are similar to those of the ADPLL 200 in FIG. 2, detailed descriptions therefor are omitted.

The sigma-delta modulator 230 performs a sigma-delta modulation on the frequency command signal. As in the ADPLL 200 of FIG. 2, the sigma-delta modulator 230 of the ADPLL 300 processes the frequency command signal (N) to increase the number of bits to be processed internally, thereby improving the system resolution without increasing the number of entire system bits.

The phase displacement calculator 341 calculates a displacement (ARDCO) of the phase information (RDCO) of the oscillation signal during a predetermined period. The measurement period can be identical with an output cycle of the retimed clock information (REFER) which is used as the clock information for the elements of the ADPLL 300. The phase displacement may be a value corresponding to the frequency of the oscillation signal.

The frequency difference detector 342 compares the sigma-delta modulation signal (ΔRREF) and the phase displacement (ΔRDCO) of the phase information (RDCO) and outputs a frequency displacement (ΔD) corresponding to the phase displacement between the frequency of the sigma-delta modulation signal (ΔRREF) and the phase information of the oscillation signal.

The frequency difference accumulator 343 accumulates the frequency difference detected by the frequency difference detector 342 and outputs phase difference information (D).

The sigma-delta modulator 230 of the ADPLL of FIGS. 2 and 3 modulates the frequency command signal (N) and outputs a modulation signal which varies more non-periodically than the frequency command signal (N). Here, the average of the modulation signals during a predetermined time period may be identical with the frequency command signal (N). Accordingly, the sigma-delta modulator 230 can reduce the spurs by distributing the periodic pattern of quantization noise as well as improving the frequency resolution.

Figure 4:
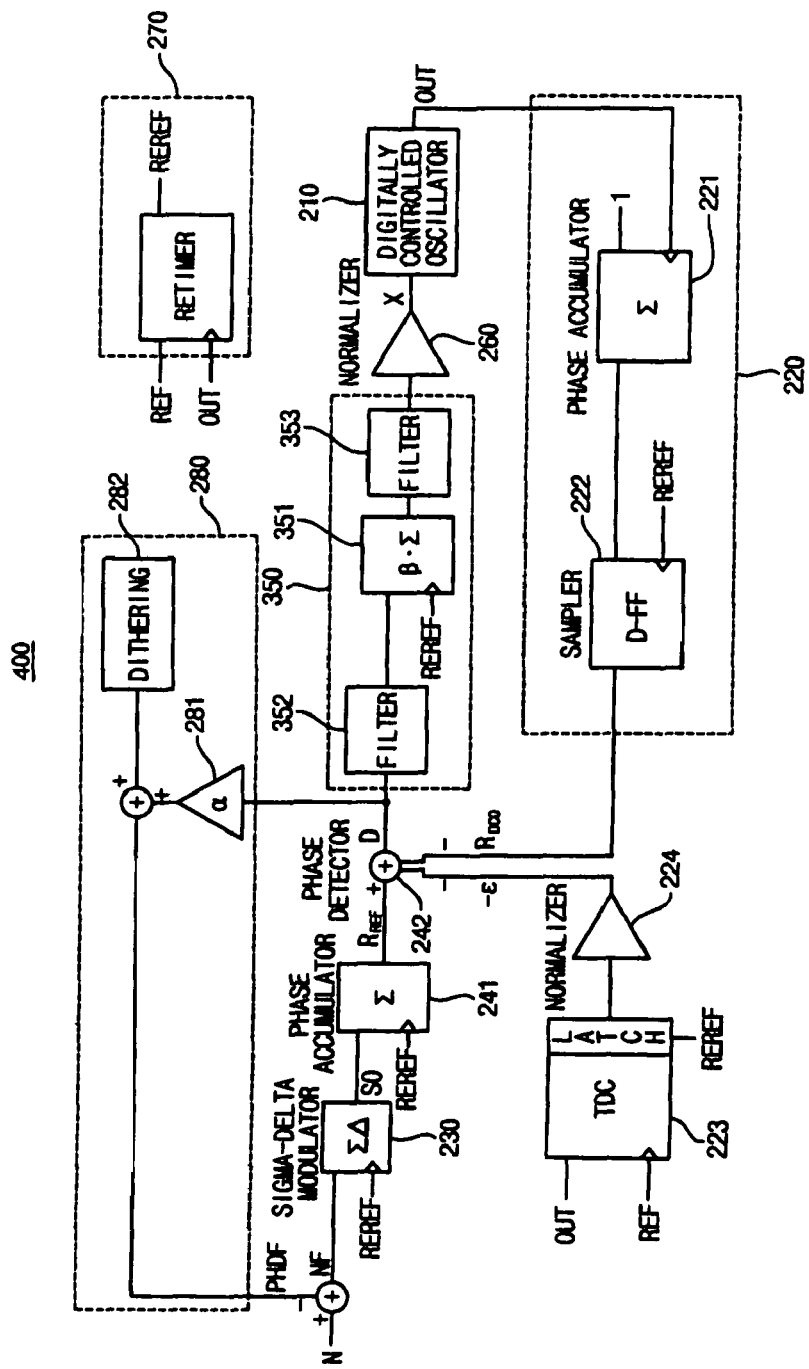
FIG. 4 is a circuit diagram illustrating a configuration of an ADPLL according to another exemplary embodiment of the present invention.

FIG. 4 is a circuit diagram illustrating a configuration of an ADPLL according to another exemplary embodiment of the present invention.

Referring to FIG. 4, the ADPLL 400 includes a digitally controlled oscillator (DCO) 210, a re-timer 270, a main feedback circuit 220, an auxiliary feedback circuit 280, a sigma-delta modulator 230, a reference phase accumulator 241, a phase difference detector 242, and a digital loop filter 350.

Since the structures and operations of the DCO 210, re-timer 270, main feedback circuit 220, and the digital loop filter 350 constituting the ADPLL 400 are similar to those of the the ADPLL 200 in FIG. 2, detailed descriptions therefor are omitted.

The auxiliary feedback circuit 280 performs scaling on a phase difference information (D) and feeds the scaled phase difference information (PHDF) back to the sigma-delta modulator 230.

The sigma-delta modulator 230 performs a sigma-delta modulation on the signal (NF) obtained by subtracting a value corresponding to the scaled phase difference information (PHDF) from the frequency command signal (N) and outputs a modulation signal (SO) of which number of bits is less than that of the frequency command signal to the reference phase accumulator 241.

The reference phase accumulator 241 accumulates the modulation signal (SO) output by the sigma-delta modulator 230 and outputs reference phase information (RREF) to the phase difference detector 242.

The phase difference detector 242 detects a phase difference between the reference phase information (RREF) and the oscillation signal phase information (RDCO) and outputs a phase difference information (D) to the digital loop filter 350. The phase difference information (D) may be fed back via the auxiliary feedback circuit 280.

The digital loop filter 350 filters the phase difference information (D) to output a control signal (X) to the DCO 210. The ADPLL 400 may further include a normalizer 260 disposed between the digital loop filter 350 and the DCO 210 for calibrating the control signal (X).

As in the ADPLLs 200 and 300 of FIGS. 2 and 3, the sigma-delta modulator 230 of the ADPLL 400 provided at the front end improves the frequency resolution of the system and reduces spurs.

Figure 1:
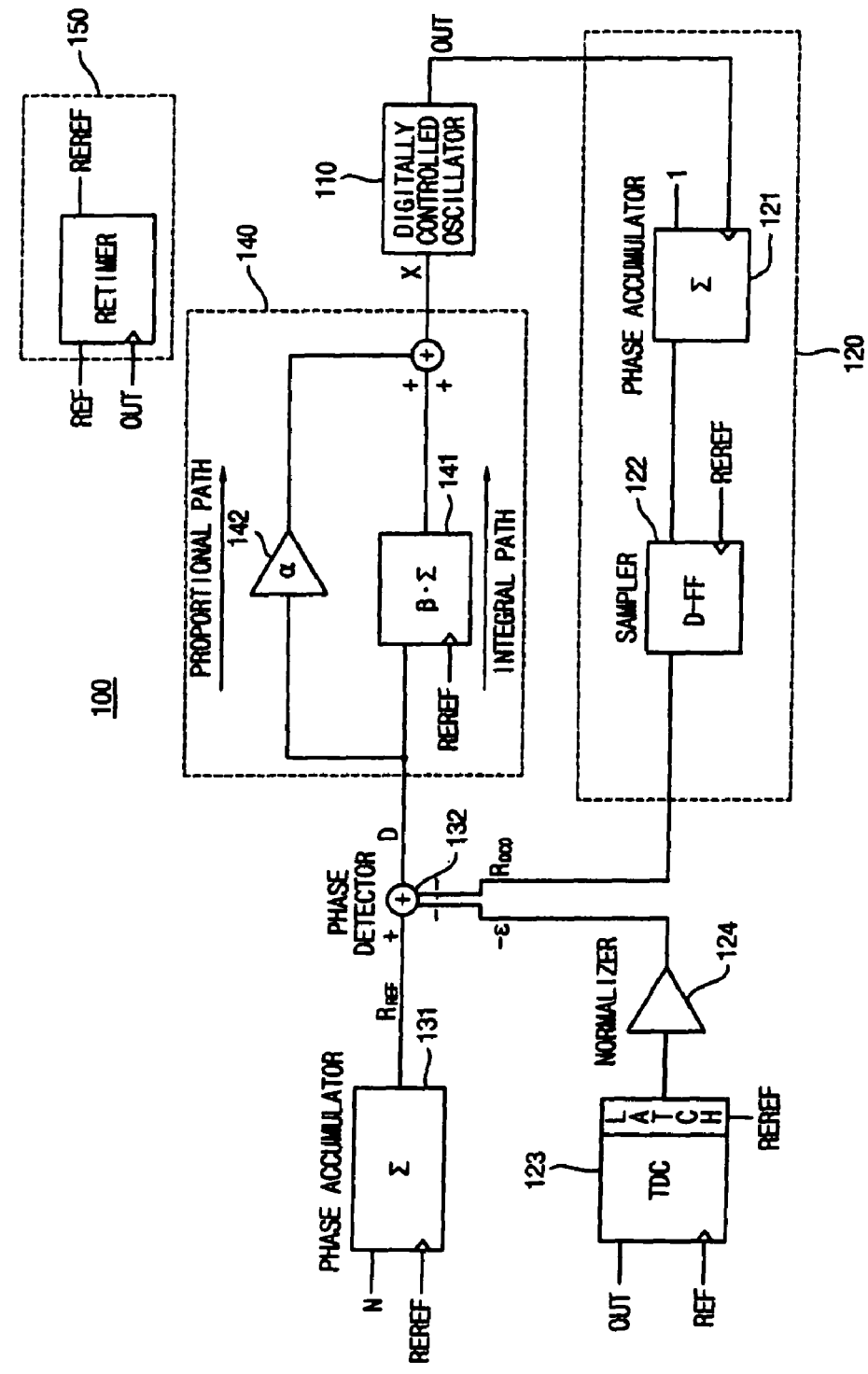
FIG. 1 is a circuit diagram illustrating a conventional ADPLL.

Furthermore, the ADPLL 400 of this embodiment includes the auxiliary feedback circuit 280 feeding back the phase difference information (D) so as to generate the identical phase difference information without the first path 142 to the digital loop filter 150 (see FIG. 1). Accordingly, the ADPLL 400 according to this embodiment can cancel the quantization noise propagated to the digital loop filter 150 of the conventional ADPLL 100.

The auxiliary feedback circuit 280 may include a dithering block 282 which generates a logical high value and a logical low value alternately and adds the values to the least significant bits of the phase difference information (D). The sigma-delta modulator 230 is likely to output signals in a periodic pattern, when the input signal is simple, so as to cause spurs. The dithering block 282 provides the sigma-delta modulator 230 with a non-periodic pattern of signals so as to distribute the periodic pattern of the output signal, thereby further reducing the quantization noise.

The ADPLL 400 according to this embodiment may further include a time-to-digital converter (TDC) 223 for converting the phase difference between the reference clock (REF) and the oscillation signal (OUT) to a digital code and a normalizer 224 for normalizing the digital code output by the TDC 223 and outputting the normalized digital code to the phase difference detector 242.

Figure 5:
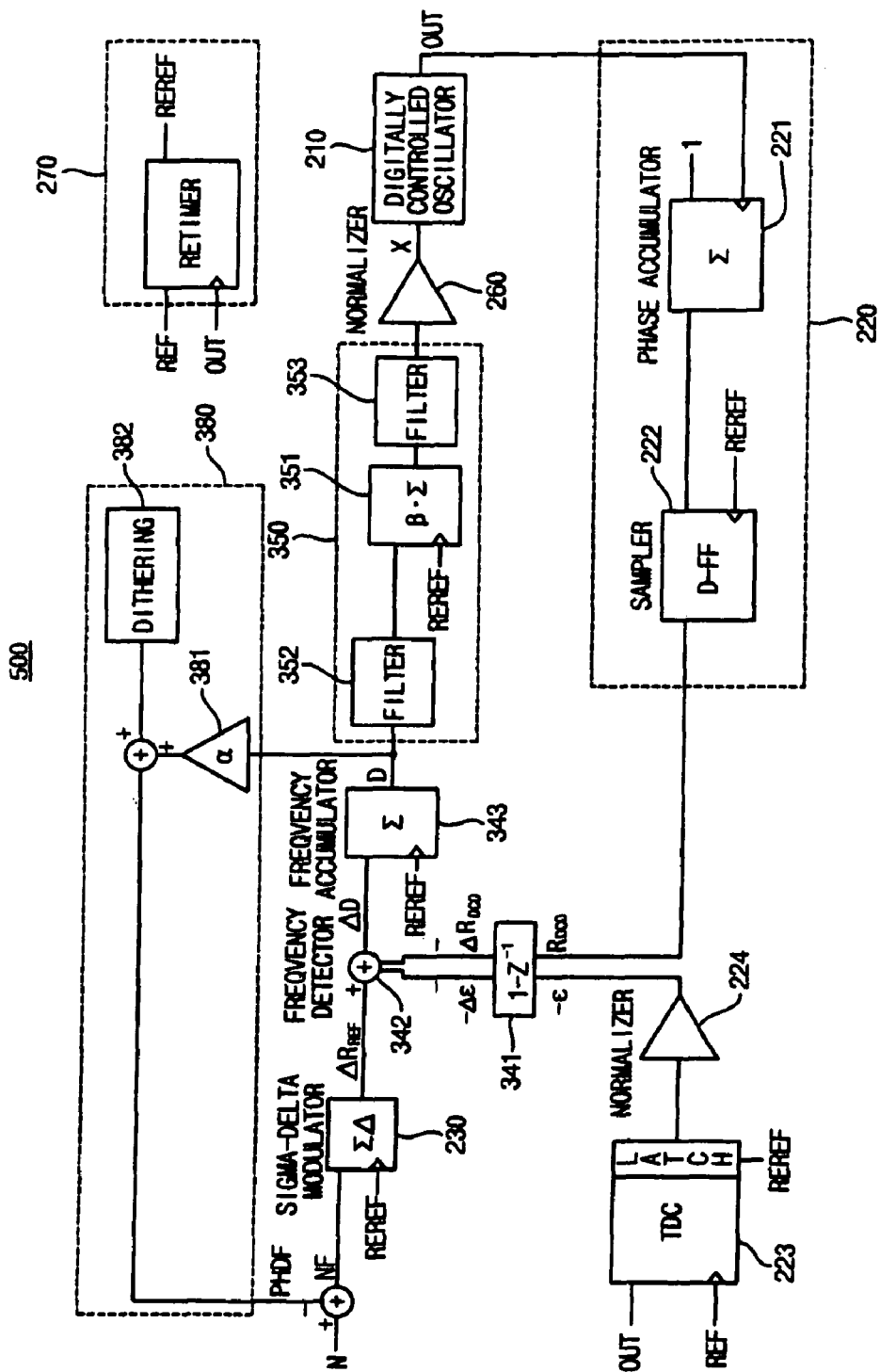
FIG. 5 is a circuit diagram illustrating a configuration of an ADPLL according to another exemplary embodiment of the present invention.

FIG. 5 is a circuit diagram illustrating a configuration of an ADPLL according to another exemplary embodiment of the present invention.

Referring to FIG. 5, the ADPLL 500 includes a digitally controlled oscillator (DCO) 210, a re-timer 270, a main feedback circuit 220, an auxiliary feedback circuit 380, a phase displacement calculator 341, a sigma-delta modulator 230, a frequency difference detector 342, a frequency difference accumulator 343, and a digital loop filter 350.

Since the structures and operations of the DCO 210, re-timer 270, main feedback circuit 220, phase displacement calculator 341, frequency difference detector 342, and the digital loop filter 350 constituting the ADPLL 500 are similar to those of the the ADPLL 300 in FIG. 3, detailed descriptions therefor are omitted.

The sigma-delta modulator 230 modulates a signal (NF) obtained by subtracting a value corresponding to a scaled phase difference information (PHDF) fed back by the auxiliary feedback circuit 380 from a frequency command signal (N) and outputs a modulation signal of which number of bits is less than that of the frequency command signal (N).

The phase displacement calculator 341 calculates a displacement ($\Delta$RDCO) of the phase information (RDCO) of the oscillation signal during a predetermined period.

The frequency difference detector 342 compares the sigma-delta modulation signal ($\Delta$RREF) and the phase displacement ($\Delta$RDCO) of the phase information (RDCO) and outputs a frequency displacement ($\Delta$D) corresponding to the phase displacement between the frequency of the sigma-delta modulation signal ($\Delta$RREF) and the phase information of the oscillation signal.

As in the ADPLL 400 of FIG. 4, the sigma-delta modulator 230 of the ADPLL 500 provided at the front end improves the frequency resolution of the system and reduces spurs. Also, the ADPLL 500 can reduce the quantization noise caused by the digital loop filter 150 (see FIG. 1) by means of the auxiliary feedback circuit 380.

The auxiliary feedback circuit 380 of the ADPLL 500 according to this embodiment may include a dithering block 382 which generates a logical high value and a logical low value alternately and adds the values with the least significant bits of the phase difference information (D). The dithering block 382 provides the sigma-delta modulator 230 with a non-periodic pattern of signals so as to distribute the periodic pattern of the output signal, thereby further reducing the quantization noise in addition to reduction by the sigma-delta modulator 230.

The ADPLL 500 according to this embodiment may further include a time-to-digital converter (TDC) 223 for converting the phase difference between the reference clock (REF) and the oscillation signal (OUT) to a digital code and a normalizer 224 for normalizing the digital code output by the TDC 223 and outputting the normalized digital code to the phase displacement calculator 341.

Figure 6:
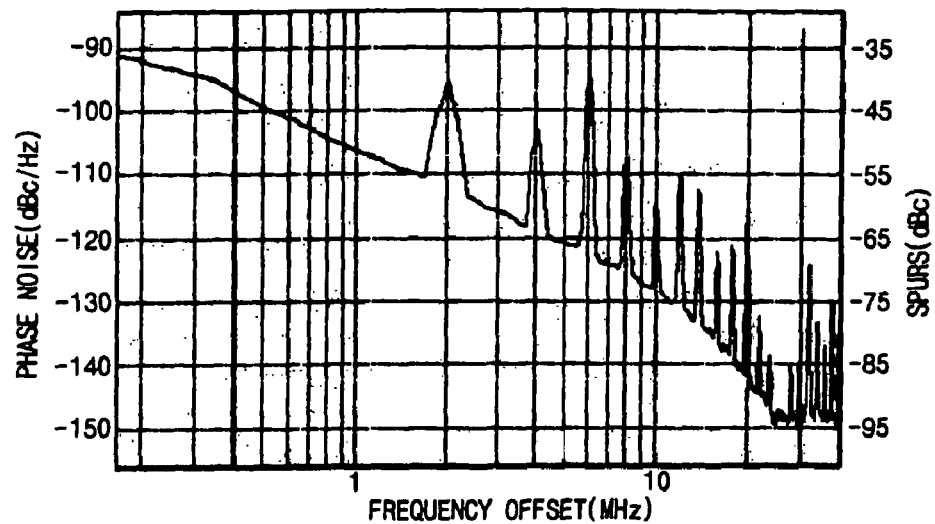
FIG. 6 is a graph illustrating a performance simulation result of a conventional ADPLL.
Figure 7:
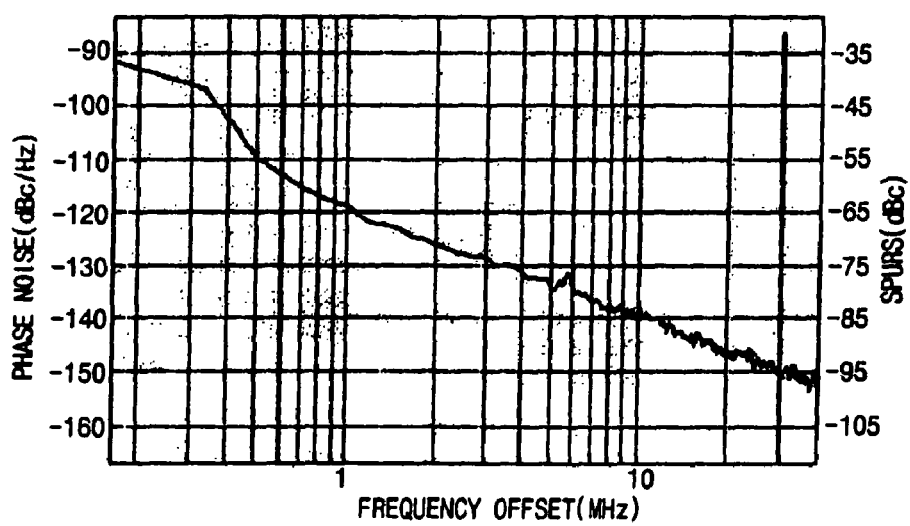
FIG. 7 is a graph illustrating a performance simulation result of an ADPLL according to an exemplary embodiment of the present invention.

FIGS. 6 and 7 are graphs illustrating results of performance simulations of the conventional ADPLL and the ADPLL according to an exemplary embodiment of the present invention.

In FIGS. 6 and 7, the horizontal axis indicates frequency offset to a target frequency, and the vertical axis indicates phase noise or spur amount. The simulation results of FIGS. 6 and 7 shows that the ADPLL according to an exemplary embodiment of the present invention produces low phase noises and suppresses the spurs in the entire frequency range in comparison with the conventional ADPLL.

As described above, the ADPLL and oscillation signal generation method using the ADPLL according to the present invention is advantageous to apply to various electric devices since it can improve system resolution and reduce quantization noise caused by limited resolution, using at least one of a sigma-delta modulator and an auxiliary feedback circuit without compromising system complexity.

Although exemplary embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. An all digital phase-locked loop comprising:
   a digitally controlled oscillator for generating an oscillation signal having a frequency corresponding to an inputted control signal;
   a re-timer for retiming a reference clock based on the oscillation signal;

a feedback circuit for accumulating a number of clocks of
the oscillation signal within a time period and generating
a phase information of the oscillation signal in synchronization with the retimed reference clock;

a sigma-delta modulator for sigma-delta modulating a frequency command signal into a modulation signal having
a less number of bits than a number of bits of the frequency command signal;

a reference phase accumulator for accumulating phases
corresponding to the modulation signal;

a phase difference detector for generating a phase difference information between an output signal of the reference phase accumulator and the phase information; and a digital loop filter for filtering the phase difference information to generate the control signal.

2. The all digital phase-locked loop of claim 1 is characterized in that a number of bits of the modulation signal output by the sigma-delta modulator is locked, and the number of bits of the frequency command signal and a number of bits processed by the sigma-delta modulator are adjusted to increase a resolution of the all digital phase-locked loop.

3. The all digital phase-locked loop of claim 1 is characterized in that a variation of the modulation signal is less periodic than a variation of the frequency command signal, and an average of the modulation signal is identical with the frequency command signal.

4. The all digital phase-locked loop of claim 1, wherein the feedback circuit comprises:

an oscillation signal phase accumulator for accumulating
the number of clocks of the oscillation signal; and an extractor for outputting the phase information of the
oscillation signal in synchronization with the retimed
reference clock on the basis of the number of clocks of
the oscillation signal.

5. The all digital phase-locked loop of claim 4, further comprising:

a time-to-digital converter for converting a phase difference between the reference clock and the oscillation
signal into a digital code; and a normalizer for normalizing the digital code and outputting the normalized digital code to the phase difference
detector.

6. An all digital phase-locked loop comprising:

a digitally controlled oscillator for generating an oscillation signal having a frequency corresponding to an
inputted control signal;

a re-timer for retiming a reference clock based on the
oscillation signal;

a feedback circuit for accumulating a number of clocks of
the oscillation signal within a time period and generating
a phase information of the oscillation signal in synchronization with the retimed reference clock;

a phase displacement calculator for calculating a phase
displacement of the phase information of the oscillation
signal within a time period;

a sigma-delta modulator for sigma-delta modulating a frequency command signal into a modulation signal having
a less number of bits than a number of bits of the frequency command signal;

a frequency difference detector for detecting a frequency
difference between a frequency corresponding to the
modulation signal and a frequency corresponding to the
phase displacement;

a frequency difference accumulator for generating a phase
difference information by accumulating the frequency
difference; and a digital loop filter for filtering the phase difference information to generate the control signal.

7. The all digital phase-locked loop of claim 6 is characterized in that a number of bits of the modulation signal output by the sigma-delta modulator is locked, and the number of bits of the frequency command signal and a number of bits processed by the sigma-delta modulator are adjusted to increase a resolution of the all digital phase-locked loop.

8. The all digital phase-locked loop of claim 6 is characterized in that a variation of the modulation signal is less periodic than a variation of the frequency command signal, and an average of the modulation signal is identical with the frequency command signal.

9. The all digital phase-locked loop of claim 6, wherein the feedback circuit comprises:

an oscillation signal phase accumulator for accumulating
the number of clocks of the oscillation signal; and an extractor for outputting the phase information of the
oscillation signal in synchronization with a retimed reference clock on the basis of the number of clocks of the
oscillation signal.

10. The all digital phase-locked loop of claim 9, further comprising:

a time-to-digital converter for converting the phase difference between the reference clock and the oscillation
signal into a digital code; and a normalizer for normalizing the digital code and outputting the normalized digital code to the phase displacement calculator.

11. An all digital phase-locked loop comprising:

a digitally controlled oscillator for generating an oscillation signal having a frequency corresponding to an
inputted control signal;

a re-timer for retiming a reference clock based on the
oscillation signal;

a main feedback circuit for accumulating a number of
clocks of the oscillation signal within a time period and
generating a phase information of the oscillation signal
in synchronization with the retimed reference clock;

an auxiliary feedback circuit for scaling a phase difference
information and feeding back the scaled phase difference information;

a sigma-delta modulator for sigma-delta modulating a
value obtained by subtracting the scaled phase difference information from a frequency command signal into
a modulation signal having a less number of bits than a
number of bits of the frequency command signal;

a reference phase accumulator for accumulating a phase
corresponding to the modulation signal;

a phase difference detector for detecting a difference
between an output signal of the reference phase accumulator and the phase information of the oscillation
signal and generating the phase difference information;
and a digital loop filter for filtering the phase difference information to generate the control signal.

12. The all digital phase-locked loop of claim 11 is characterized in that a number of bits of the modulation signal output by the sigma-delta modulator is locked, and the number of bits of the frequency command signal and a number of bits processed by the sigma-delta modulator are adjusted to increase a resolution of the all digital phase-locked loop.

13. The all digital phase-locked loop of claim 11 is characterized in that a variation of the modulation signal is less periodic than a variation of the frequency command signal, and an average of the modulation signal is identical with the frequency command signal.

14. The all digital phase-locked loop of claim 11, wherein the main feedback circuit comprises:
- an oscillation signal phase accumulator for accumulating the number of clocks of the oscillation signal; and
- an extractor for outputting the phase information of the oscillation signal in synchronization with the retimed reference clock on the basis of the number of clocks of the oscillation signal.

15. The all digital phase-locked loop of claim 14, further comprising:
- a time-to-digital converter for converting a phase difference between the reference clock and the oscillation signal into a digital code; and
- a normalizer for normalizing the digital code and outputting the normalized digital code to the phase difference detector.

16. The all digital phase-locked loop of claim 11, wherein the auxiliary feedback circuit comprises a dithering block for generating a logical high value and a logical low value non-periodically and adding the values to least significant bits of the phase difference information.

17. An all digital phase-locked loop comprising:
- a digitally controlled oscillator for generating an oscillation signal having a frequency corresponding to an inputted control signal;
- a re-timer for retiming a reference clock based on the oscillation signal;
- a main feedback circuit for accumulating a number of clocks of the oscillation signal within a time period and generating phase information of the oscillation signal in synchronization with the retimed reference clock;
- an auxiliary feedback circuit for scaling a phase difference information and feeding back the scaled phase difference information;
- a phase displacement calculator for calculating a phase displacement of the phase information of the oscillation signal in a predetermined time period;
- a sigma-delta modulator for sigma-delta modulating a value obtained by subtracting the scaled phase difference information from a frequency command signal into a modulation signal having a less number of bits than a number of bits of the frequency command signal;
- a frequency difference detector for detecting a frequency difference between a frequency corresponding to the modulation signal and a frequency corresponding to the phase displacement;
- a frequency difference accumulator for generating the phase difference information by accumulating the frequency difference; and
- a digital loop filter for filtering the phase difference information to generate the control signal.

18. The all digital phase-locked loop of claim 17 is characterized in that a number of bits of the modulation signal output by the sigma-delta modulator is locked, and the number of bits of the frequency command signal and a number of bits processed by the sigma-delta modulator are adjusted to increase a resolution of the all digital phase-locked loop.

19. The all digital phase-locked loop of claim 17 is characterized in that a variation of the modulation signal is less periodic than a variation of the frequency command signal, and an average of the modulation signal is identical with the frequency command signal.

20. The all digital phase-locked loop of claim 17, wherein the main feedback circuit comprises:
- an oscillation signal phase accumulator for accumulating the number of clocks of the oscillation signal; and
- an extractor for outputting the phase information of the oscillation signal in synchronization with the retimed reference clock on the basis of the number of clocks of the oscillation signal.

21. The all digital phase-locked loop of claim 20, further comprising:
- a time-to-digital converter for converting a phase difference between the reference clock and the oscillation signal into a digital code; and
- a normalizer for normalizing the digital code and outputting the normalized digital code to the phase displacement calculator.

22. The all digital phase-locked loop of claim 17, wherein the auxiliary feedback circuit comprises a dithering block for generating a logical high value and a logical low value non-periodically and adding the values to least significant bits of the phase difference information.

23. A method for generating an oscillation signal using an all digital phase-locked loop, comprising:
- generating an oscillation signal of a frequency corresponding to an inputted control signal;
- retiming a reference clock based on the oscillation signal;
- generating a phase information of the oscillation signal by accumulating a number of clocks of the oscillation signal in synchronization with the retimed reference clock;
- scaling the phase difference information;
- feeding back the scaled phase difference information;
- sigma-delta modulating a signal obtained by subtracting a value corresponding to the phase difference information from a frequency command signal into a modulation signal; and
- generating the control signal on the basis of the phase information of the oscillation signal and the modulation signal.

24. The method of claim 23, wherein the modulation signal varies less periodically than the frequency command signal varies, and an average of the modulation signal is identical with the frequency command signal.

25. The method of claim 23, wherein feeding back the scaled phase difference information comprises generating a logical high value and a logical low value non-periodically and adding the values to least significant bits of the phase difference information.

* * * * *